United States Patent
Guo et al.

(10) Patent No.: US 9,754,981 B2
(45) Date of Patent: Sep. 5, 2017

(54) SOLID STATE PHOTOMULTIPLIER HAVING AN INTERMEDIATE REGION COUPLED BETWEEN HIGH AND LOW VOLTAGE REGIONS AND ASSOCIATED DETECTOR

(71) Applicant: GENERAL ELECTRIC COMPANY, Schenectady, NY (US)

(72) Inventors: Jianjun Guo, Ballston Spa, NY (US); Sergei Ivanovich Dolinsky, Clifton Park, NY (US); Jonathan David Short, Saratoga Springs, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 15/077,006

(22) Filed: Mar. 22, 2016

(65) Prior Publication Data

US 2016/0358957 A1  Dec. 8, 2016

Related U.S. Application Data

(60) Provisional application No. 62/171,300, filed on Jun. 5, 2015.

(51) Int. Cl.
   *H01L 27/146*   (2006.01)
   *H01L 31/107*   (2006.01)
   *H01L 31/0352*  (2006.01)

(52) U.S. Cl.
   CPC .. *H01L 27/14612* (2013.01); *H01L 27/14663* (2013.01); *H01L 31/035272* (2013.01)

(58) Field of Classification Search
   CPC ......... H01L 27/14612; H01L 27/14663; H01L 31/035272; H01L 31/107; H01L 31/103;
   (Continued)

(56) References Cited

U.S. PATENT DOCUMENTS 5,933,042 A * 8/1999 Trottier .............. H03K 17/0416
                                                    327/326
6,307,196 B1 * 10/2001 Thompson ................ G01J 1/44
                                                     250/214 A (Continued)

FOREIGN PATENT DOCUMENTS

GB         2509545 A      7/2014

OTHER PUBLICATIONS

Thomas Frach, "Digital Silicon Photomultiplier for Low Light Detection in High Energy Physics", CERN Detector Seminar, pp. 1-77, Oct. 21, 2011.

(Continued)

*Primary Examiner* — Marc Armand
*Assistant Examiner* — Younes Boulghassoul
(74) *Attorney, Agent, or Firm* — Pabitra K. Chakrabarti

(57) ABSTRACT

Embodiments of a solid state photomultiplier are provided herein. In some embodiments, a solid state photomultiplier may include an epitaxial layer, a high voltage region formed in the epitaxial layer, a low voltage region formed in the epitaxial layer, and an intermediate region disposed between the high voltage region and low voltage region, wherein the high voltage region is electrically coupled to the low voltage region via the intermediate region, and wherein at least a portion of the epitaxial layer is disposed between the high voltage region and intermediate region and between the low voltage region and the intermediate region.

18 Claims, 7 Drawing Sheets

(58) Field of Classification Search
CPC ............. H01L 31/105; H01L 31/02106; H01L 31/02027; H01L 31/072; G01T 1/248; G01T 1/247
USPC ......... 257/292, 291, 438; 356/222; 250/215, 250/214.1, 214 R
See application file for complete search history.

(56) References Cited

U.S. PATENT DOCUMENTS

| | | | |
|---|---|---|---|
| 6,858,912 B2 | 2/2005 | Marshall et al. | |
| 7,361,882 B2* | 4/2008 | Forsyth | G01J 1/44 |
| | | | 250/214 R |
| 7,453,131 B2 | 11/2008 | Marshall et al. | |
| 7,897,906 B2* | 3/2011 | Deschamps | H03K 17/0416 |
| | | | 250/214 R |
| 8,259,293 B2 | 9/2012 | Andreou et al. | |
| 8,994,136 B2* | 3/2015 | Park | H01L 27/1446 |
| | | | 257/438 |
| 2001/0017786 A1* | 8/2001 | Woodward | H01L 31/107 |
| | | | 365/120 |
| 2001/0020863 A1* | 9/2001 | Cova | G01J 1/44 |
| | | | 327/514 |
| 2013/0193546 A1 | 8/2013 | Webster et al. | |
| 2013/0334411 A1 | 12/2013 | Brunel et al. | |
| 2014/0191115 A1* | 7/2014 | Webster | H01L 31/107 |
| | | | 250/214 R |
| 2014/0217264 A1 | 8/2014 | Shepard et al. | |

OTHER PUBLICATIONS

B. Berube et al.., "Development of a single photon avalanche diode (SPAD) array in high voltage CMOS 0.8 μm dedicated to a 3D integrated circuit (3DIC)", 2012 IEEE Nuclear Science Symposium and Medical Imaging Conference Record (NSS/MIC), pp. 1835-1839, Oct. 27-Nov. 3, 2012.

E. Vilella et al.,"Readout schemes for low noise single-photon avalanche diodes fabricated in conventional HV-CMOS technologies", Microelectronics Journal, vol. 44, Issue 10, pp. 941-947, Oct. 2013.

* cited by examiner

SOLID STATE PHOTOMULTIPLIER HAVING AN INTERMEDIATE REGION COUPLED BETWEEN HIGH AND LOW VOLTAGE REGIONS AND ASSOCIATED DETECTOR

CROSS REFERENCE TO RELATED APPLICATION

This patent application claims the benefit of priority, under 35 U.S.C. §119, of U.S. Provisional patent application Ser. No. 62/171,300, filed Jun. 5, 2015, titled "METHOD OF ACTIVE QUENCHING AND RESETTING APD" the entire disclosure of which is incorporated herein by reference.

BACKGROUND

The subject matter disclosed herein generally relates to detectors for use in imaging systems, such as X-ray, nuclear medicine imaging systems, combinations thereof, or the like.

Conventional imagining technologies generally include one or more detectors configured to convert incident radiation to useful electrical signals that can be used in image formation. Such detectors may employ solid state photomultipliers (SSPM) (e.g., silicon photomultipliers (SiPM)), which may be useful for detecting optical signals generated in a scintillator in response to the incident radiation. Typical mechanisms utilized to read out analog SSPM pixels may include either AC or DC coupling of the SSPM signal to external electronics. However, due to stray or parasitic capacitance along the signal path, the signal may be degraded, thereby causing the detector to suffer from crosstalk, signal integrity degradation and additional noise.

The inventors have observed that integrating the readout electronics with the SSPM on the same die may be one mechanism to reduce such crosstalk or signal noise, and preserve signal integrity. However, readout electronics fabricated via conventional mechanisms (e.g., CMOS processes) typically operate at a significantly lower voltage as compared to the high voltage components (e.g., avalanche photodiodes (APDs)) of the SSPM, which requires additional components (e.g., resistors) to rectify the incompatibility, thereby making the SSPM unnecessarily complex and limiting performance. Alternatively, high voltage CMOS electronics may be utilized in place of the typical low voltage readout electronics. However, such high voltage components are noisier, slower and require a higher power as compared to the low voltage readout electronics.

Thus, the inventors have provided an improved solid state photomultiplier.

BRIEF DESCRIPTION OF THE INVENTION

Embodiments of a solid state photomultiplier are provided herein. In some embodiments, a solid state photomultiplier may include an epitaxial layer, a high voltage region formed in the epitaxial layer, a low voltage region formed in the epitaxial layer, and an intermediate region disposed between the high voltage region and low voltage region, wherein the high voltage region is electrically coupled to the low voltage region via the intermediate region, and wherein at least a portion of the epitaxial layer is disposed between the high voltage region and intermediate region and between the low voltage region and the intermediate region.

In some embodiments, a detector for an imaging system may include a detector assembly having a plurality of solid state photomultipliers coupled to readout electronics, wherein each of the solid state photomultipliers comprises an epitaxial layer, a high voltage region formed in the epitaxial layer, a low voltage region formed in the epitaxial layer, and an intermediate region disposed between the high voltage region and low voltage region, wherein the high voltage region is electrically coupled to the low voltage region via the intermediate region, and wherein at least a portion of the epitaxial layer is disposed between the high voltage region and intermediate region and between the low voltage region and the intermediate region.

The foregoing and other features of embodiments of the present invention will be further understood with reference to the drawings and detailed description.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

Embodiments of a solid state photomultiplier are disclosed herein. In at least some embodiments, the inventive solid state photomultiplier (SSPM) advantageously provides a mechanism that facilitates an integration of high voltage region (e.g., avalanche photodiode (APD)) and a low voltage region (e.g., readout electronics) of an SSPM. In addition, in at least some embodiments, the inventive solid state photomultiplier (SSPM) advantageously allows for a coupling of the high voltage region and low voltage region utilizing conventional CMOS fabrication techniques, and further, utilizing conventional CMOS fabrication techniques without the addition or alteration of process steps that would otherwise be employed in the fabrication process. In addition, in at least some embodiments, the inventive solid state photomultiplier (SSPM) advantageously provides a bridging of the high voltage region and low voltage region, while using only available low voltage devices, thereby allowing for each region to be operated within its respective operating parameters.

Embodiments discussed herein relate to a detector in a nuclear imaging system, such as a positron emission tomography (PET) or single photon emission computed tomography (SPECT) imaging system or in a combined or hybrid imaging system including such PET or SPECT imaging functionality (e.g., a PET/MR, a PET/CT, or a SPECT/CT imaging system). It should be appreciated, however, that the present devices may also be employed in other types of imaging modalities or detectors used to detect radiation or nuclear particles, such as radiographic detectors used in X-ray based imaging modalities (e.g., fluoroscopy, mammography, computed tomography (CT), tomosynthesis, angiography, and so forth). However, to simplify explanation, and to facilitate discussion in the context of a concrete example, the present discussion will be provided in the context of a nuclear imaging system.

Figure 1:
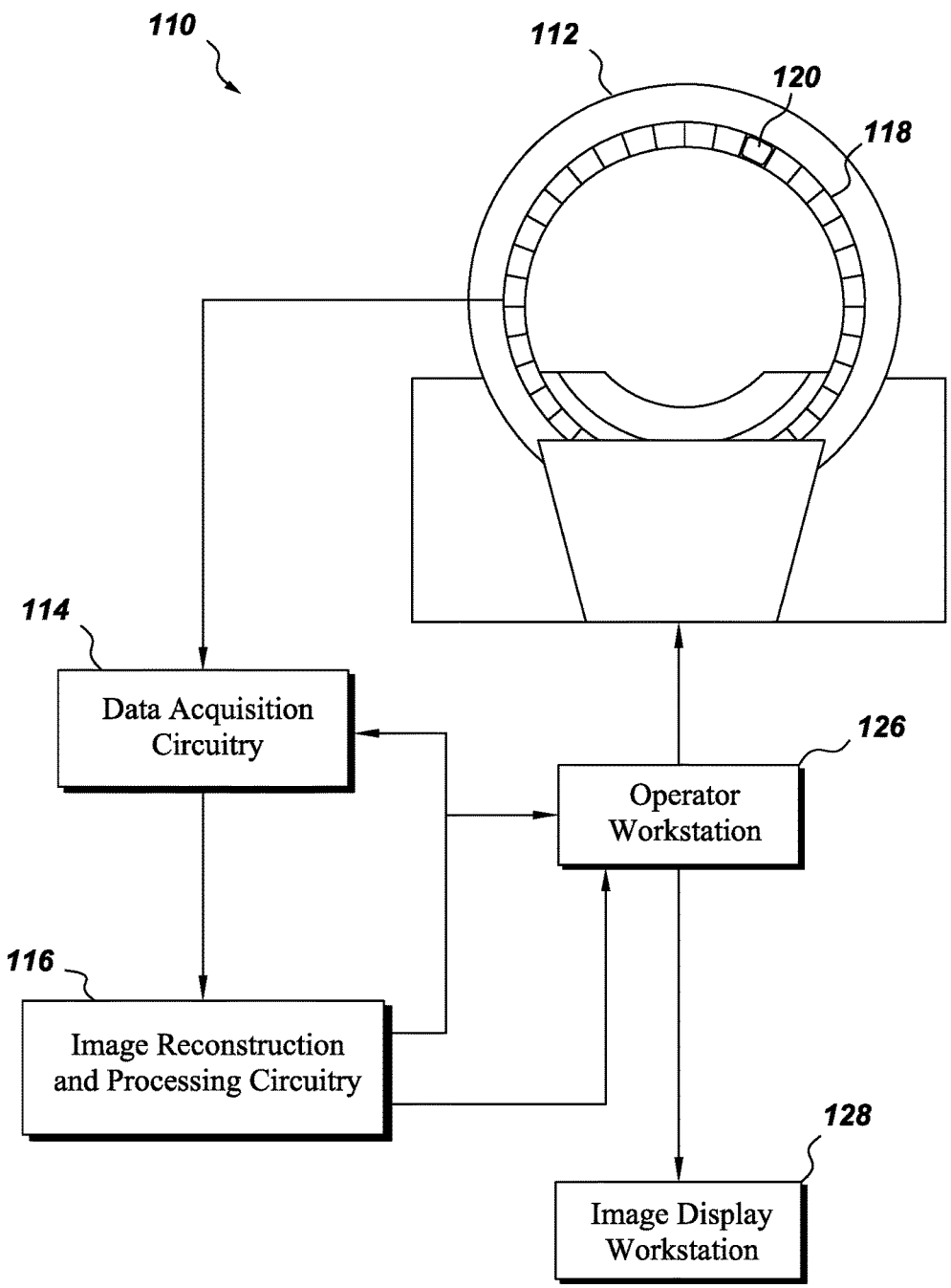
FIG. 1 is a diagrammatical representation of an exemplary PET imaging system.

FIG. 1 is a diagrammatical representation of an exemplary PET imaging system in accordance with some aspects of the present invention. Though a PET system 110 is described and discussed herein, it should be appreciated that the present approach may also be useful in other imaging contexts, such as in a SPECT or CT imaging system.

The depicted PET system 110 includes a detector assembly (detector) 112, data acquisition circuitry 114, and image reconstruction and processing circuitry 116. The detector assembly 112 of the PET system 110 typically includes a number of detector modules (generally designated by reference numeral 118) arranged about the imaging volume, as depicted in FIG. 1. As discussed herein the detector assembly 112, via the modules 118, may be configured to generate signals in response to gamma rays generated by positron annihilation events and emitted from a subject within the imaged volume. In certain implementations, the detector modules 118 can include scintillators and photon detection electronics. The detector assembly 112 may be of any suitable construction and configuration for acquiring PET data. For example, as in the depicted example, the detector assembly 112 can be configured as a full or partial ring.

In certain implementations, gamma rays may be converted, such as in a scintillator of the detector modules 118, to lower energy photons that in turn may be detected and converted in the detector modules 118 to electrical signals, which can be conditioned and processed to output digital signals. In certain imaging applications, to overcome the low number of optical photons generated in response to impinging radiation at the scintillator (i.e., the low signal level), a solid state photomultiplier or silicon photomultiplier (SiPM) may be combined with a scintillator to provide amplification of the signals.

The signals generated by the detector modules 118 can be used to match pairs of gamma ray detections as potential coincidence events. That is, in such a PET implementation, when two gamma rays strike opposing detectors it may be determined that a positron annihilation occurred somewhere on the line connecting the two impact locations (absent the effects of interactions of randoms and scatter detections). In SPECT implementations, line of flight information may instead be inferred based at least in part on the collimation associated with the detector assembly. The collected data can be sorted and integrated and used in subsequent processing such as by image reconstruction and processing circuitry 116.

Thus, in operation, the detector acquisition circuitry 114 is used to read out the signals from the detector modules 118 of the detector assembly 112, where the signals are generated in response to gamma rays emitted within the imaged volume. The signals acquired by the detector acquisition circuitry 114 are provided to the image reconstruction and processing circuitry 116. The image reconstruction and processing circuitry 116 generates an image based on the derived gamma ray emission locations. The operator workstation 126 is utilized by a system operator to provide control instructions to some or all of the described components and for configuring the various operating parameters that aid in data acquisition and image generation. The operating workstation 126 may also display the generated image. Alternatively, the generated image may be displayed at a remote viewing workstation, such as the image display workstation 128.

It should be appreciated that, to facilitate explanation and discussion of the operation of the PET system 110, the detector acquisition circuitry 114 and the image reconstruction and processing circuitry 116 have been shown separately in FIG. 1 from other illustrated components (e.g., the detector assembly 112, the operator workstation 126, and the image display workstation 128). However, it should be appreciated that, in certain implementations, some or all of these circuitries may be provided as part of the detector assembly 112, the operator workstation 126, and/or the image display workstation 128. For example, the hardware, software, and/or firmware executed on or provided as part of the data acquisition circuitry 114, whether provided as part of the detector assembly 112, the operator workstation 126, and/or the image display workstation 128, may be used to perform various detector readout and/or control actions described herein. In certain implementations the data acquisition circuitry 114 may include specially configured or programmed hardware, memory, or processors (e.g., application-specific integrated circuits (ASICs)) for performing detector readout steps as discussed herein. Similarly, certain of these readout functions may be performed using one or more general or special purpose processors and stored code or algorithms configured to execute on such processors. Likewise, a combination of special purpose hardware and/or circuitry may be used in conjunction with one or more processors configured to execute stored code to implement the steps discussed herein.

With the preceding in mind, the detector technology in one implementation of a system such as that depicted in FIG. 1 will be discussed in greater detail. In particular, a PET or SPECT system may comprise a photosensor 120 that utilizes arrays of solid-state photo multiplier devices as part of the gamma ray detection mechanism, such as within detector modules 118. Solid state photomultipliers (SSPMs), which are also commonly referred to as MicroPixel Photon Counters (MPPC) or MicroPixel Avalanche Photodiodes (MAPD) have become popular for use as photosensors. Typically, SSPMs are implemented as Silicon Photomultipliers (SiPM). Such devices may take the form, in certain implementations, of an array of microcells (e.g., comprising passively quenched Geiger-mode avalanche photodiodes (APD)) for detecting impinging photons. In general, SSPM devices used for photon detection can provide information about certain parameters, such as the time of the impingement event, the energy associated with the event, and the position of the event within the detector. These parameters can be determined through processing algorithms applied to the output signals generated by the SSPM.

In some embodiments, a multichannel readout front-end application-specific integrated circuit (ASIC) may interface with an array of SSPMs in a PET (or SPECT) system. The ASIC may be provided as part of the data acquisition circuitry 114 of FIG. 1 and may be configured to provide information on the timing, energy, and location of events in each SSPM to a processing system (e.g., processing circuitry 116), as well as the ability to bias each SSPM.

Figure 2:
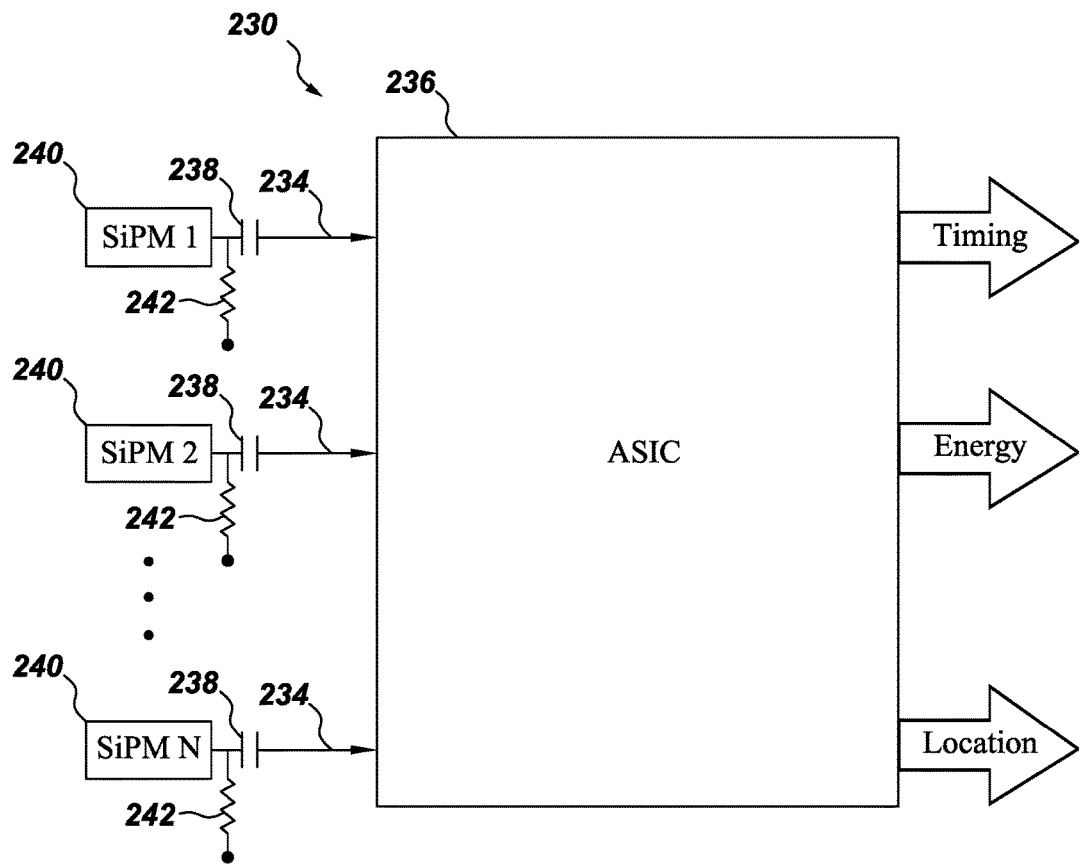
FIG. 2 is a block diagram of an exemplary conventional front-end readout electronics for a PET data acquisition system.

Turning to FIG. 2, a block diagram is depicted representing one example of a front-end readout electronics of a PET data acquisition system 230, such as may be used with the PET system 110 of FIG. 1. The PET data acquisition system 230 may include a plurality of pixels (SSPMs) 240 as well as multiple ASICs 236 as part of the detector modules (118 of FIG. 1) and/or data acquisition circuitry (114 of FIG. 1). Light generated in a scintillator in response to a gamma ray interaction is detected by a pixel and amplified. In this example, each SSPM 240 includes an anode output 234 in electrical communication with the ASIC 236 via a capacitor 238. That is, the outputs of the SSPMs 240 are the inputs to the respective ASIC 236. Each SSPM 240 may be further electrically coupled to a resistor 242.

The ASIC 236, in turn provides one or more of timing signals, energy signals, and/or position signals as outputs. Each of these signals output by the ASIC 236 corresponds to information obtained from the respective SSPMs 240 after processing by the ASIC 236. Although only three SSPMs 240 are shown in the figure, the PET data acquisition system 230 may comprise any number of SSPMs 240 suitable to facilitate a desired functionality of the PET data acquisition system 230. For example, in some embodiments, the front-end readout electronics of a data acquisition system 230 may include eighteen (18) SSPMs 240. However, in other implementations, other quantities of SSPMs 240 may be present within a data acquisition system 230.

The solid state photomultipliers 240 may be fabricated using any materials suitable to provide the desired functionality as described herein. For example, in some embodiments, each SSPM 240 may be formed using silicon as a semiconductor material, although other suitable semiconductor materials could instead be used (e.g. Si, SiC, AlxGal-xAs, GaP, GaN alloys thereof and the like).

Figure 3:
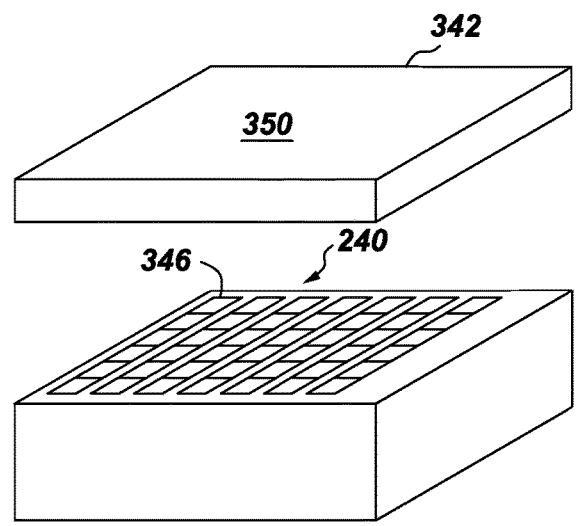
FIG. 3 depicts a perspective view of a detector element.

In some embodiments, each SSPM 240 may include a plurality of microscopic units, referred to as microcells. By way of illustration, a single SSPM 240 is shown in FIG. 3 to illustrate certain of the present concepts. The number of microcells 346 on a SSPM 240 is typically sufficient to provide effective dynamic range for the SSPM 240. The area of a SSPM 240 is sufficient to cover one or more crystal elements 350 formed on the scintillator 342. However, it should be appreciated that the exact number and density of the SSPMs 240 will be determined by detector module design to achieve the optimal performance and other known factors.

As depicted in FIG. 3, a single SSPM 240 pixel is comprised of a plurality of microcells 346 that amplify single optical photon arrivals from the scintillator 342 into an output signal, wherein each microcell 346 comprises one or more APDs. Typically, each SSPM 240 will contain a large number of microcells 346 (e.g., thereby providing between 100 to 2,500 APDs per mm$^2$). In some embodiments, each of the microcells 346 may have a length of between 20 microns to 100 microns. In one implementation, each of the microcells 346 may operate as an individual Geiger-mode APD a few volts above a breakdown voltage, with each microcell 346 being virtually identical to all the other microcells. In this mode of operation, an electron or hole generated by the absorption of an optical photon initiates an avalanche breakdown that is confined to an individual microcell 346 when the one or more photons are absorbed by that microcell 346.

In some embodiments, each microcell 346 functions independently of the others to detect photons. In such embodiments, a single discrete unit of electrical charge is emitted from the microcell 346 independent of the number of photons absorbed therein. That is, for each Geiger breakdown, the output signal of the microcell 346 will have substantially the same shape and charge. In some embodiments, the microcells are electrically connected in parallel to yield an integrated current over some area over which the signals are being aggregated, such as a SSPM 240. The summed discharge currents of the microcells 346 are indicative of the incidence of radiation over a given area. This quasi-analog output is capable of providing magnitude information regarding the incident photon flux over the area for which signals are being aggregated.

Figure 4:
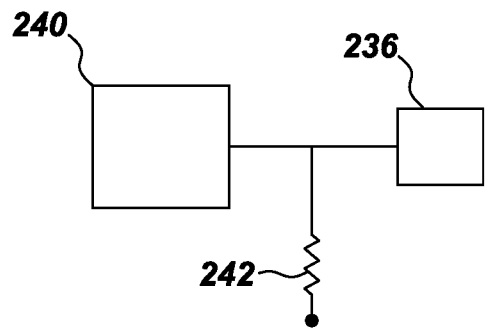
FIG. 4 is a schematic view of an exemplary front-end readout electronics for a PET data acquisition.

Conventional SSPM array configurations typically include coupling each pixel (SSPM 240 of FIG. 2) to the ASIC/readout electronics (ASIC 236) via either AC or DC coupling of the SSPM signal to external electronics (shown schematically in FIG. 4). In some conventional configurations, the readout electronics may be integrated with the SPPM on a common die to eliminate or reduce crosstalk or signal noise. Such mechanisms typically include interfacing high voltage electronics (e.g., APD fabricated in a high voltage well) with low voltage electronics (e.g., readout electronics fabricated in a low voltage well) on the same die to DC couple the signal generated by the APD to the readout electronics.

Figure 5:
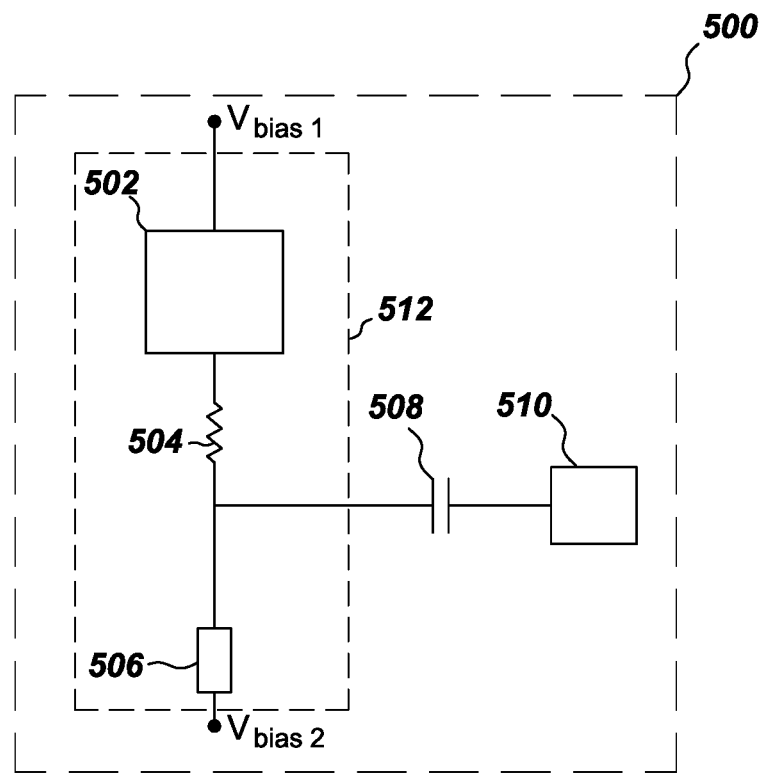
FIG. 5 is an electrical schematic of an exemplary microcell.

One example of such a configuration is schematically shown in FIG. 5. In the depicted embodiment, the sensing element 512 of the microcell 500 comprises an avalanche photodiode (APD) 502 and at least one of impedance circuitry (e.g., a frequency dependent input impedance circuit) 506 and a resistor 504 coupled thereto. In such embodiments, the APD 502 is coupled to the readout electronics 510 via a capacitor 508 (e.g., the capacitor formed by the isolation well as described herein). The impedance circuitry 506 may include any passive or active components known in the art, for example, such as one or more resistors.

Referring to the partial cross section view of an exemplary SSPM 600 in FIG. 6, a conventional integration of a low voltage region 604 and a high voltage region 602 may include a plurality of wells (described below) formed in an epitaxial layer 608 disposed atop a substrate 606. The epitaxial layer 608 and substrate 606 may comprise an n- or p-type dopant and may be similarly or oppositely doped. For example, each of the substrate 606 and epitaxial layer 608 may be an n-type layer such as shown in FIG. 6, or alternatively, a p-type layer.

In some embodiments, the low voltage region 604 may include a deep well 618 formed in the epitaxial layer 608. The deep well 618 may comprise an n- or p-type dopant and may be similarly or oppositely doped as compared to the epitaxial layer 608. For example, in embodiments where the epitaxial layer 608 is an n-type layer, the deep well 618 may be a p-type well, for example such as shown in FIG. 6.

Figure 6:
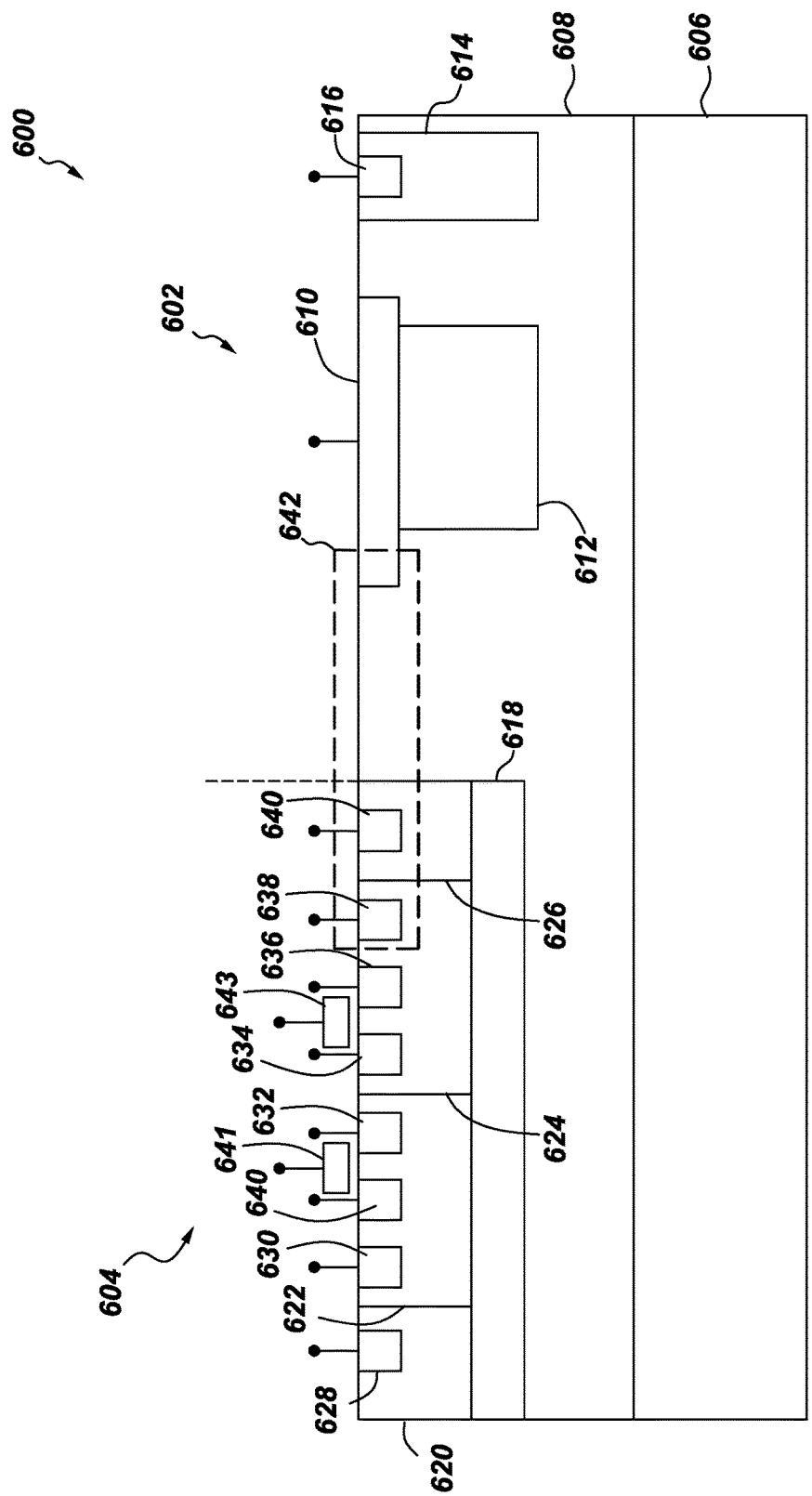
FIG. 6 depicts a cross sectional view of a portion of a solid state photomultiplier.

In some embodiments, one or more wells may be formed in the deep well (first deep well) 618, for example, a first well 620, second well 622, third well 624 and fourth well 626, such as shown in FIG. 6. Each of the one or more wells may comprise an n- or p-type dopant and may be similarly or oppositely doped as compared to the deep well 618 or each other. For example, the first well 620, second well 622 and fourth well 626 may be a p-type well and the third well 624 may be an n-type well, such as shown in FIG. 6.

In some embodiments, each of the one or more wells may comprise one or more junctions formed therein. For example, the first well 620 and fourth well 626 may each include a junction 628, junction 640 wherein the first well 620 and fourth well 626 and the respective junctions 628, 640 comprise an n- or p-type dopant and may be similarly or oppositely doped. For example, each of the first well 620 and fourth well 626 and the respective junctions 628, 640 may be of a p-type such as shown in FIG. 6, or alternatively, an n-type.

In some embodiments, the second well 622 and third well 624 may each comprise a plurality of junctions, wherein at least one junction of the plurality of junctions within the second well 622 and third well 624 are oppositely doped from the respective second well 622 and third well 624. For example, in some embodiments, the second well 622 may be a p-type well having a p-type junction 630 and two n-type junctions 640, 632, such as shown in FIG. 6. In another example, the third well 624 may be an n-type well having an n-type junction 638 and two p-type junctions 634, 636, such as shown in FIG. 6.

In some embodiments, one or more structures may be formed above or atop any of the wells to form any device desired. For example, in some embodiments, one or more gates 641,643 may be disposed above the junction 640, 632, 634, 636 of the respective second well 622 and third well 624, such as shown in FIG. 6.

In some embodiments, the high voltage region 602 may include a plurality of deep wells (second deep well 612 and third deep well 614 shown) formed in the epitaxial layer 608. In such embodiments, the plurality of deep wells may comprise an n- or p-type dopant and may be similarly or oppositely doped as compared to the epitaxial layer 608. For example, in embodiments where the epitaxial layer 608 is an n-type layer, the second deep well 612 and third deep well 614 may each be a an n-type well, for example such as shown in FIG. 6.

In some embodiments, at least one of the plurality of deep wells may include junctions formed therein, for example such as the junction 616 disposed within the third deep well 614. In such embodiments, the junction 616 may have a similar type of dopant from that of the deep well. For example, in embodiments where the third deep well 614 is an n-type well the junction 616 may be an n-type well.

In some embodiments, the high voltage region 602 may comprise a junction 610 disposed above, and at least partially overlapping, one of the plurality of deep wells (e.g., second deep well 612). In such embodiments, the junction 610 may have an opposing type of dopant from that of the underlying deep well. For example, in embodiments where the second deep well 612 is an n-type well, the junction 610 may be a p-type well, such as shown in FIG. 6.

The inventors have observed that in the conventional integration of the high voltage region and low voltage region (e.g., such as shown in FIG. 6) the readout electronics fabricated via conventional mechanisms (e.g., CMOS processes) typically operate at a significantly lower voltage as compared to the high voltage components (e.g., avalanche photodiodes (APDs)) of the SSPM, which requires additional components (e.g., resistors) to rectify the incompatibility. For example, a conventional APD may have an operating voltage of about 30 volts (v), thereby requiring a proper quenching mechanism to halt a triggered avalanche during operation and reset the APD at a proper over-voltage (e.g. about 6 v) to allow the APD to subsequently detect the incident photons. In comparison, conventional readout electronics may have an operating voltage of about 3.3 v. As such, a number of additional components are typically required to allow for correct processing of the signal provided by the APD by the readout electronics. For example, to facilitate coupling of the high voltage region 602 and low voltage region 604 one or more wells of the low voltage region (e.g., deep well 618, third well 624, fourth well 626 and junctions therein) and one or more wells or the high voltage region 602 (e.g., well 610) may be coupled via one or more components (indicated at 642), for example, passive components such as resistors or the like.

Figure 6A:
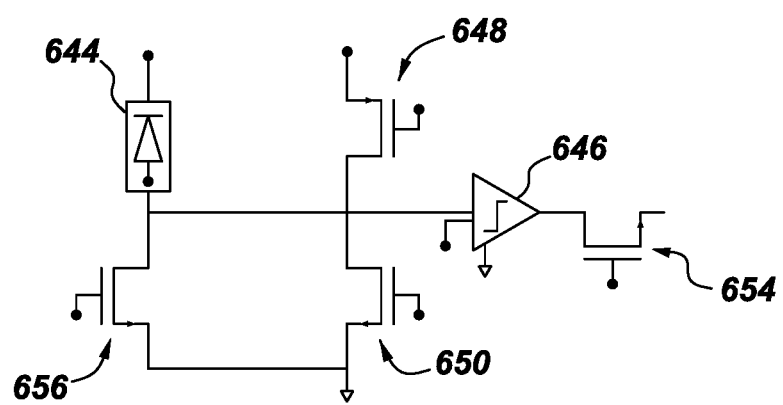
FIG. 6A is an electrical schematic of an exemplary microcell.

Conventional configurations typically employ one or more resistors disposed between the APD and readout electronics. In addition, other components, for example, components to facilitate active sensing, quenching and resetting may be required to provide acceptable performance of the SSPM. Alternatively, high voltage CMOS electronics may be utilized. For example, referring to FIG. 6A, one or more high voltage transistors (e.g., four transistors 648, 650, 656, 654) may be utilized in conjunction with the other high voltage electronic components, (e.g., comparator 646, APD 644, or the like). However, such high voltage components are noisier, slower and require a higher power as compared to the low voltage readout electronics. An additional alternative may be operation of the APD at a lower over-voltage that is compatible with the lower operating voltage of the readout electronics. However, such operation is inefficient and reduces performance.

Figure 7:
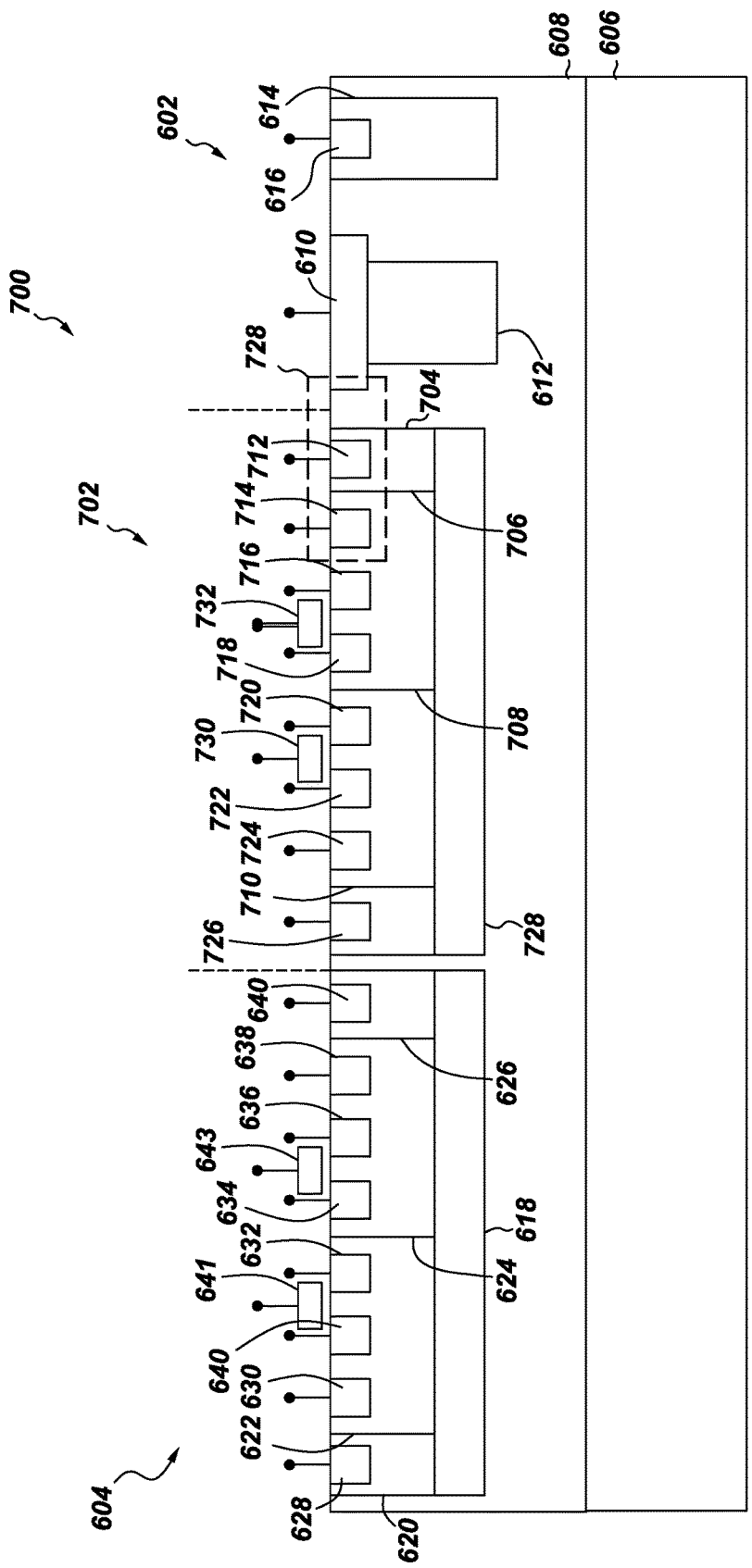
FIG. 7 depicts a cross sectional view of a portion of a solid state photomultiplier in accordance with some embodiments of the present invention.

As such, in some embodiments, the SSPM 700 may include an intermediate region 702 disposed between the high voltage region 602 and low voltage region 604, such as shown in FIG. 7. In such embodiments, at least a portion of the epitaxial layer 608 is disposed between the high voltage region 602 and intermediate region 702 and between the low voltage region 604 and the intermediate region 702.

When present, the intermediate region 702 functions to fill the voltage gap (e.g., generate a voltage drop substantially similar to the difference in operating voltages of the high voltage region 602 and low voltage region 604 described above) thereby allowing each of the high voltage region 602 and low voltage region 604 to operate within its respective and/or optimal operating parameters. In addition, the intermediate region 702 may facilitate a coupling of the high voltage region 602 and intermediate region 702 via a conductive member having no passive or active components (e.g., such as the components described above at 642), thereby reducing a number of components that would otherwise be present in a conventional device.

In an exemplary operation, the intermediate region 702, which is isolated from the high voltage region 602 and low voltage region 604 via the epitaxial layer 608 may comprise one or more devices (e.g., CMOS devices as described below) having n-wells/p-wells (e.g., wells described below) biased, or self-biased, to Vdd_B (positive voltage supply)/ Vss_B (negative voltage supply) which is at a different potential from that of the low voltage region 604 positive voltage supply (Vdd_LV) and high voltage region 602 positive voltage supply (Vdd_HV). In such instances, an absolute voltage potential may be up Vdd_HV. As such, the voltage potential difference between Vdd_B and Vss_B may be adjusted to satisfy a desired design specification and may be less than Vdd_LV. For example, in some embodiments, the intermediate region has a bias such that a voltage difference across any two terminals of a transistor (e.g., terminals of the gate, body or the like) in the intermediate region is less than a highest positive voltage of the low voltage region.

In some embodiments, the intermediate region 702 may have a similar configuration to that of the low voltage region 604. For example, the intermediate region 702 may comprise substantially similar, or in some embodiments the same, active and passive devices as compared to the low voltage region 604. By having a similar or the same configuration, the intermediate region 702 may be fabricated utilizing conventional CMOS fabrication techniques, and further, utilizing conventional CMOS fabrication techniques without the addition or alteration of process steps that would otherwise be employed in the fabrication process of the low voltage region 604.

For example, in some embodiments, the intermediate region 702 may include a deep well 728 formed in the epitaxial layer 608. The deep well 728 may comprise an n- or p-type dopant and may be similarly or oppositely doped as compared to the epitaxial layer 608. For example, in embodiments where the epitaxial layer 608 is an n-type layer, the deep well 728 may be a p-type well, for example such as shown in FIG. 7.

In some embodiments, one or more wells may be formed in the deep well (first deep well) 728, for example, a first well 710, second well 708, third well 706 and fourth well 704, such as shown in FIG. 7. Each of the one or more wells may comprise an n- or p-type dopant and may be similarly or oppositely doped as compared to the deep well 728 or each other. For example, the first well 710, second well 708 and fourth well 704 may be a p-type well and the third well 706 may be an n-type well, such as shown in FIG. 7.

In some embodiments, each of the one or more wells may comprise one or more junctions formed therein. For example, the first well 710 and fourth well 704 may each include a junction 726, 712 wherein the first well 710 and fourth well 704 and the respective junctions 726, 712 comprise an n- or p-type dopant and may be similarly or oppositely doped. For example, each of the first well 710 and fourth well 704 and the respective junctions 726, 712 may be of a p-type such as shown in FIG. 7, or alternatively, an n-type.

In some embodiments, the second well 708 and third well 706 may each comprise a plurality of junctions, wherein at least one junction of the plurality of junctions within the second well 708 and third well 706 are oppositely doped from the respective second well 708 and third well 706. For example, in some embodiments, the second well 708 may be a p-type well having a p-type junction 724 and two n-type junctions 720, 722, such as shown in FIG. 7. In another example, the third well 706 may be an n-type well having an n-type junction 714 and two p-type junctions 716, 718, such as shown in FIG. 7.

In some embodiments, one or more structures may be formed above or atop any of the wells to form any device desired. For example, in some embodiments, one or more gates 730, 732 may be disposed above the junctions 722, 720, 718, 716 of the respective second well 708 and third well 706, such as shown in FIG. 7.

Figure 8:
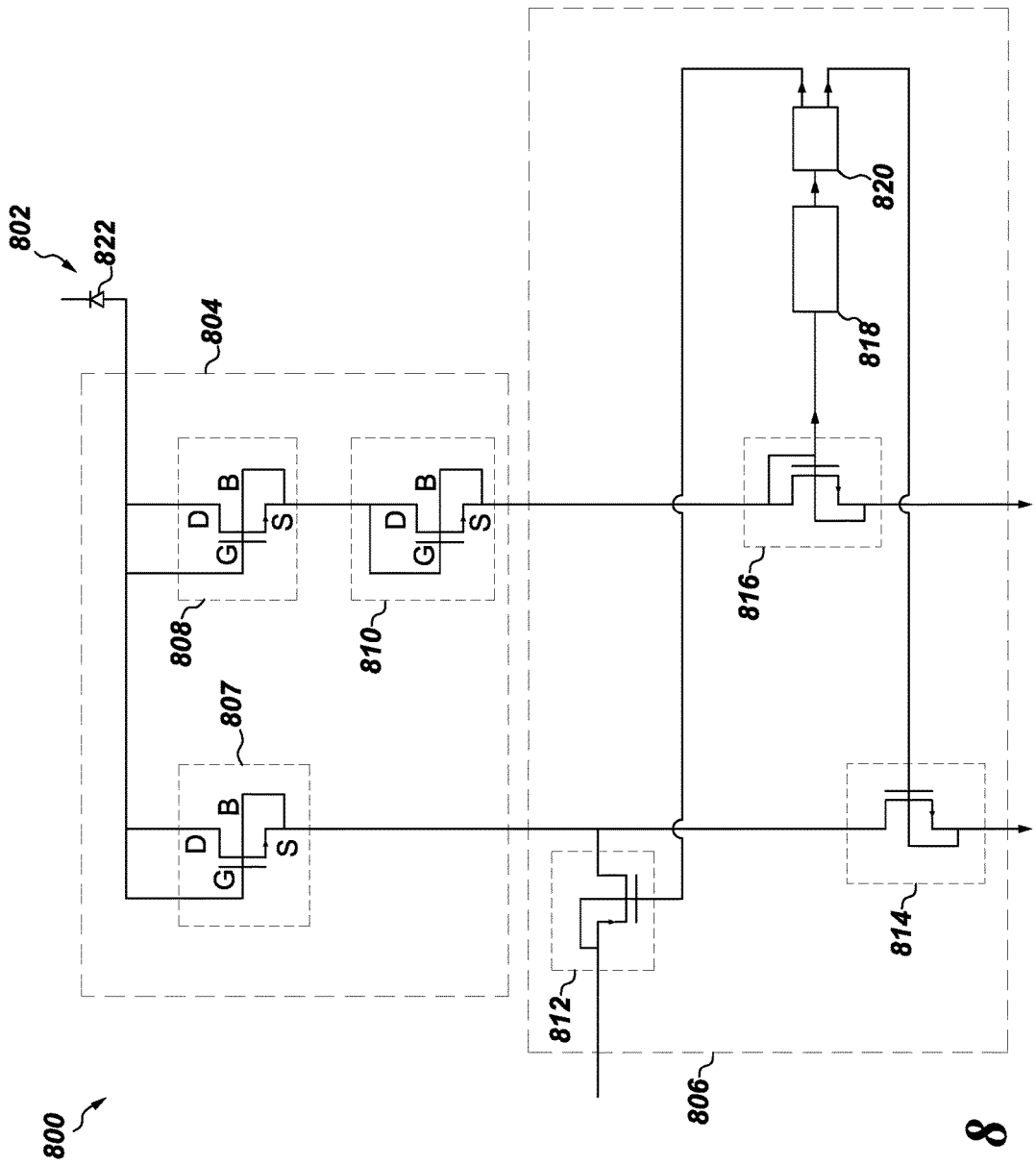
FIG. 8 depicts an electrical schematic of the solid state photomultiplier shown in FIG. 7 in accordance with some embodiments of the present invention.

FIG. 8 depicts an electrical schematic of the solid state photomultiplier shown in FIG. 7 in accordance with some embodiments of the present invention. In some embodiments, the transistors 807, 808, 810 (e.g., formed at least in part by the wells and gates described above) of the intermediate region 804 may be configured in a diode connection and each comprising a coupling between the gate (g) and drain (d) and between the source (s) and substrate. As such, the configuration may function as a floating diode. In such embodiments, the diode may be implemented via p-type and n-type floating diodes.

In operation, upon the arrival of a photon, the APD 822 (high voltage region 802) develops an avalanche. The avalanche current flows through the transistors 808, 810 of the intermediate region 804 and the transistor 816 of the low voltage region 806. Consequently, an anode voltage of the APD 822 rises to up to about an over voltage (Vov) of the SSPM 800. Due to a voltage drop (as described above) on the diode-connected transistors 808, 810, a voltage at the drain (Vd) of the transistor 816 (sensing transistor) may be represented by $$Vd = Vov - Vth_1 - Vth_2$$

where $Vth_1$ is the voltage drop at transistor 810 and $Vth_2$ is the voltage drop at transistor 808. Although shown as having a particular configuration, in some embodiments, a single diode-connected transistor, or two or more diode-connected transistors may be coupled in series.

In some embodiments, the SSPM 800 may include a sensing block 818 that functions to monitor a voltage change at the gate (g) of the transistor 816. If the sensing block 818 detects a voltage higher than pre-set threshold, a controller 820 coupled to the sensing block 818 may send a signal to quench, and then reset, the APD 822 via one or more of the transistors (e.g., transistors 812, 814) of the low voltage zone 806.

In any of the above embodiments, each of the layers, wells, gate structures or the like may be fabricated via any suitable semiconductor fabrication process and may be dependent on a particular application for which the inventive device is intended. In addition, each of the layers, wells, gate structures or the like may be fabricated from any material suitable for semiconductor device fabrication, for example, silicon or the like.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A solid state photomultiplier, comprising:
   an epitaxial layer;
   a high voltage region formed in the epitaxial layer and comprising an avalanche photodiode;
   a low voltage region formed in the epitaxial layer and comprising at least one of quenching or resetting circuits;
   an intermediate region disposed between the high voltage region and low voltage region, wherein the high voltage region is electrically coupled to the low voltage region via the intermediate region, and wherein at least a portion of the epitaxial layer is disposed between the high voltage region and intermediate region and between the low voltage region and the intermediate region;
   wherein the at least one of quenching or resetting circuits comprises transistors; and
   wherein the transistors are not high voltage transistors.

2. The solid state photomultiplier of claim 1, wherein the intermediate region and the low voltage region comprise substantially similar active and passive devices.

3. The solid state photomultiplier of claim 1, wherein each of the low voltage region and intermediate region comprises:
   a deep well formed in the epitaxial layer; and
   a plurality of wells formed in the deep well, wherein the deep well comprises one of an n-type or p-type dopant and wherein at least one of the plurality of wells comprises an n-type or p-type dopant opposite that of the deep well.

4. The solid state photomultiplier of claim 3, wherein the deep well and plurality of wells formed in the deep well of the intermediate region are self-biased.

5. The solid state photomultiplier of claim 3, wherein the deep well and plurality of wells formed in the deep well of the intermediate region has a bias such that a voltage difference across any two terminals of a transistor in the intermediate region is less than a highest positive voltage of the low voltage region.

6. The solid state photomultiplier of claim 3, wherein the high voltage region comprises:
   a deep well formed in the epitaxial layer; and
   a well disposed above and at least partially overlapping the deep well, wherein the deep well comprises one of an n-type or p-type dopant and the well disposed above the deep well comprises an n-type or p-type dopant opposite that of the deep well, and wherein the well disposed above the deep well is electically coupled to the deep well of the intermediate region.

7. The solid state photomultiplier of claim 3, wherein each of the low voltage region and intermediate region comprises at least one gate structure formed above the deep well to form at least one transistor in the low voltage region and at least one transistor in the intermediate voltage region.

8. The solid state photomultiplier of claim 7, wherein the at least one transistor formed in the intermediate region comprises an electrical coupling between a gate and a drain and between a source and a substrate of the transistor.

9. The solid state photomultiplier of claim 1, wherein the solid state photomultiplier is a silicon photomultiplier.

10. A detector for an imaging system, comprising:
    a detector assembly having a plurality of solid state photomultipliers coupled to readout electronics, wherein each of the solid state photomultipliers comprises:
    an epitaxial layer;
    a high voltage region formed in the epitaxial layer and comprising an avalanche photodiode;
    a low voltage region formed in the epitaxial layer and comprising at least one of quenching or resetting circuits;
    an intermediate region disposed between the high voltage region and low voltage region, wherein the high voltage region is electrically coupled to the low voltage region via the intermediate region, and wherein at least a portion of the epitaxial layer is disposed between the high voltage region and intermediate region and between the low voltage region and the intermediate region.;
    wherein the at least one of quenching or resetting circuits comprises transistors; and
    wherein the transistors are not high voltage transistors.

11. The detector of claim 10, wherein the intermediate region and the low voltage region comprise substantially similar active and passive devices.

12. The detector of claim 10, wherein each of the low voltage region and intermediate region comprises:
    a deep well formed in the epitaxial layer; and
    a plurality of wells formed in the deep well, wherein the deep well comprises one of an n-type or p-type dopant and wherein at least one of the plurality of wells comprises an n-type or p-type dopant opposite that of the deep well.

13. The detector of claim 12, wherein the deep well and plurality of wells formed in the deep well of the intermediate region are self-biased.

14. The detector of claim 12, wherein the deep well and plurality of wells formed in the deep well of the intermediate region has a bias such that a voltage difference across any two terminals of a transistor in the intermediate region is less than a highest positive voltage of the low voltage region.

15. The detector of claim 12, wherein the high voltage region comprises:
    a deep well formed in the epitaxial layer; and
    a well disposed above and at least partially overlapping the deep well, wherein the deep well comprises one of an n-type or p-type dopant and the well disposed above the deep well comprises an n-type or p-type dopant opposite that of the deep well, and wherein the well disposed above the deep well is electically coupled to the deep well of the intermediate region.

16. The detector of claim 12, wherein each of the low voltage region and intermediate region comprises at least one gate structure formed above the deep well to form at least one transistor in the low voltage region and at least one transistor in the intermediate voltage region.

17. The detector of claim 16, wherein the at least one transistor formed in the intermediate region comprises an electrical coupling between a gate and a drain and between a source and a substrate of the transistor.

18. The detector of claim 10, wherein the solid state photomultiplier is a silicon photomultiplier.

* * * * *